United States Patent
Criss et al.

(10) Patent No.: US 7,886,983 B2
(45) Date of Patent: Feb. 15, 2011

(54) CONDENSATION PREVENTION SYSTEM AND METHODS OF USE

(75) Inventors: Karl M. Criss, Columbus, OH (US);
David A. Dukes, Columbus, OH (US);
Thomas E. Harvey, Columbus, OH (US)

(73) Assignee: Liebert Corporation, Columbus, OH (US)

( * ) Notice: Subject to any disclaimer, the term of this patent is extended or adjusted under 35 U.S.C. 154(b) by 620 days.

(21) Appl. No.: 11/775,604

(22) Filed: Jul. 10, 2007

(65) Prior Publication Data

US 2009/0014548 A1 Jan. 15, 2009

(51) Int. Cl.
*F24F 3/14* (2006.01)

(52) U.S. Cl. .................... 236/44 C; 236/94; 62/125; 165/231

(58) Field of Classification Search .............. 236/44 C, 236/91, 94; 62/176.6, 150, 125, 127, 259.2; 165/231, 232
See application file for complete search history.

(56) References Cited

U.S. PATENT DOCUMENTS

| | | | | |
|---|---|---|---|---|
| 4,512,161 A | * | 4/1985 | Logan et al. | 62/176.6 |
| 4,572,427 A | * | 2/1986 | Selfridge et al. | 236/3 |
| 5,136,856 A | * | 8/1992 | Yamamoto et al. | 62/176.6 |
| 5,144,811 A | * | 9/1992 | Brodie et al. | 62/176.6 |
| 5,671,805 A | | 9/1997 | Stahl et al. | |
| 5,746,060 A | * | 5/1998 | Sunaga et al. | 62/126 |
| 5,778,689 A | * | 7/1998 | Beatenbough | 62/150 |
| 5,870,898 A | * | 2/1999 | Choi | 62/89 |
| 5,934,368 A | * | 8/1999 | Tanaka et al. | 165/233 |
| 5,960,638 A | * | 10/1999 | McCabe et al. | 62/90 |
| 6,079,216 A | * | 6/2000 | de Marsillac Plunkett et al. | 62/56 |
| 6,161,765 A | * | 12/2000 | Kay et al. | 236/49.3 |
| 6,223,817 B1 | * | 5/2001 | Oden et al. | 165/232 |
| 6,557,624 B1 | | 5/2003 | Stahl et al. | |
| 6,563,048 B2 | | 5/2003 | Holt et al. | |
| 6,564,571 B2 | | 5/2003 | Feeney | |
| 6,564,858 B1 | | 5/2003 | Stahl et al. | |
| 6,642,487 B2 | * | 11/2003 | Stanzel | 219/494 |
| 6,705,389 B1 | | 3/2004 | Stahl et al. | |
| 6,754,066 B2 | | 6/2004 | Doan et al. | |
| 6,832,732 B2 | * | 12/2004 | Burkett et al. | 236/44 C |
| 6,840,052 B2 | * | 1/2005 | Smith et al. | 62/126 |

(Continued)

FOREIGN PATENT DOCUMENTS

DE 199479945 * 4/2001

(Continued)

OTHER PUBLICATIONS

International Search Report for Corresponding International Patent Application No. PCT/US2008/051240.

(Continued)

*Primary Examiner*—George Nguyen
(74) *Attorney, Agent, or Firm*—Locke Lord Bissell & Liddell LLP

(57) ABSTRACT

A method of preventing condensation on equipment inside a temperature-controlled enclosure comprises measuring the temperature in at least one location inside the enclosure. The temperature inside the enclosure is compared with a safe temperature, at which the risk of condensation is reduced. The temperature inside the enclosure is increased until the safe temperature is achieved. A user is then notified that it is safe to access the enclosure.

20 Claims, 2 Drawing Sheets

U.S. PATENT DOCUMENTS

| | | | |
|---|---|---|---|
| 6,854,659 B2 | 2/2005 | Stahl et al. | |
| 6,881,898 B2 | 4/2005 | Baker et al. | |
| 7,032,397 B1 * | 4/2006 | Mueller et al. | 62/230 |
| 7,051,802 B2 | 5/2006 | Baer | |
| 7,135,787 B2 * | 11/2006 | Alexandropoulos | 307/10.4 |
| 7,448,435 B2 * | 11/2008 | Garozzo | 165/11.1 |
| 7,472,554 B2 * | 1/2009 | Vosburgh | 62/126 |
| 7,559,209 B2 * | 7/2009 | Nicolai et al. | 62/259.2 |
| 7,631,509 B2 * | 12/2009 | Shavit | 62/150 |
| 2003/0136135 A1 * | 7/2003 | Kim et al. | 62/125 |
| 2004/0035123 A1 * | 2/2004 | Kim et al. | 62/127 |
| 2004/0172954 A1 * | 9/2004 | Hanson et al. | 62/125 |
| 2004/0190270 A1 | 9/2004 | Aldag et al. | |
| 2005/0207116 A1 | 9/2005 | Yatskov et al. | |
| 2006/0180301 A1 | 8/2006 | Baer | |
| 2006/0196206 A1 * | 9/2006 | Murray et al. | 62/248 |
| 2007/0003700 A1 * | 1/2007 | Roche et al. | 427/372.2 |
| 2007/0030650 A1 | 2/2007 | Madara et al. | |
| 2007/0033887 A1 * | 2/2007 | Ambrose | 52/171.3 |
| 2008/0141689 A1 * | 6/2008 | Sunderland et al. | 62/151 |

FOREIGN PATENT DOCUMENTS

| | | |
|---|---|---|
| EP | 405149 A2 * | 1/1991 |
| EP | 0444570 A | 9/1991 |
| JP | 2003008275 A | 1/2003 |
| JP | 2006114532 A | 4/2006 |

OTHER PUBLICATIONS

Written Opinion for Corresponding International Patent Application No. PCT/US2008/051240.

* cited by examiner

CONDENSATION PREVENTION SYSTEM AND METHODS OF USE

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

1. Field of the Invention

The inventions disclosed and taught herein relate generally to methods and systems for controlling the environment inside an electronics enclosure; and more specifically related to a method and system for preventing condensation on electronic equipment within an enclosed cabinet.

2. Description of the Related Art

Electronic equipment is used for diverse applications in many fields. This equipment must often be installed in environments in which the air temperature or humidity are outside the recommended operating parameters for the equipment. In such cases, it is commonly known to install the equipment in a protective enclosure. The temperature inside the enclosure is controlled to maintain the proper operating environment for the equipment. Depending on the environment outside the enclosure, opening the enclosure can cause moisture to condense on the equipment inside the enclosure. This condensation could damage the equipment and cause it to malfunction. Therefore, it is desirable to regulate the environment within the enclosure to minimize the risk of condensation on the equipment when a user accesses the enclosure.

The inventions disclosed and taught herein are directed to improved systems and methods for regulating the environment within an enclosure so that a user can gain access to the equipment while reducing the risk of condensation forming on the equipment when the enclosure is opened.

BRIEF SUMMARY OF THE INVENTION

A method of preventing condensation on equipment inside a temperature-controlled enclosure comprises determining the temperature in at least one location inside the enclosure. The temperature inside the enclosure is compared with a target temperature, at which the risk of condensation is reduced. If a user desires access to the inside of the enclosure, the temperature inside the enclosure is increased until the target temperature is achieved. The user is then notified that it is safe to access the enclosure.

DETAILED DESCRIPTION

Figure 1:
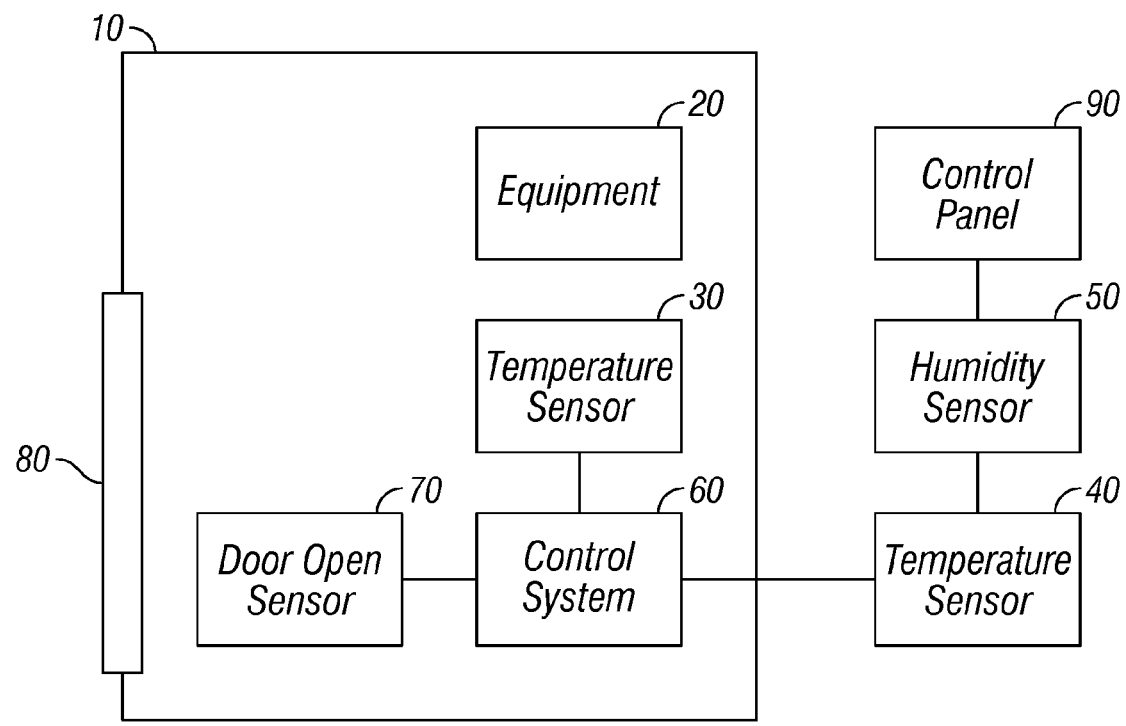
FIG. 1 illustrates the condensation prevention system installed on an enclosure containing equipment.

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure.

Particular embodiments of the invention may be described below with reference to block diagrams and/or operational illustrations of methods. It will be understood that each block of the block diagrams and/or operational illustrations, and combinations of blocks in the block diagrams and/or operational illustrations, can be implemented by analog and/or digital hardware, and/or computer program instructions. Such computer program instructions may be provided to a processor of a general purpose computer, special purpose computer, ASIC, and/or other programmable data processing system. The executed instructions may create structures and functions for implementing the actions specified in the block diagrams and/or operational illustrations. In some alternate implementations, the functions/actions/structures noted in the figures may occur out of the order noted in the block diagrams and/or operational illustrations. For example, two operations shown as occurring in succession, in fact, may be executed substantially concurrently or the operations may be executed in the reverse order, depending upon the functionality/acts/structure involved.

Computer programs for use with or by the embodiments disclosed herein may be written in an object oriented programming language, conventional procedural programming language, or lower-level code, such as assembly language and/or microcode. The program may be executed entirely on a single processor and/or across multiple processors, as a stand-alone software package or as part of another software package.

It must be understood that the inventions disclosed and taught herein are susceptible to numerous and various modifications and alternative forms. The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims.

Applicants have created an improved system for regulating the environment within an enclosure so that a user may open the enclosure without causing condensation to form on equipment within the enclosure. The improved condensation prevention system accepts input from a user requesting access to the enclosure. Upon receiving input indicating that the user wishes to open the enclosure, the system compares the air temperature and/or humidity within the enclosure to a target temperature and/or humidity. In the preferred embodiment, the target temperature corresponds to the ambient dewpoint of the air outside the enclosure plus a margin of error. If the ambient dewpoint exceeds the target temperature, the system increases the air temperature within the enclosure until it reaches a temperature at least as high as the target temperature.

In one embodiment, the condensation prevention system includes a display. The display shows a warning notification while the air temperature inside the enclosure is lower than the target temperature. The warning notification alerts the user that opening the enclosure could lead to the formation of condensation on equipment within the enclosure. When the temperature inside the enclosure is at least as high as the target temperature, the display shows a notification advising the user that it is safe to open the enclosure.

In another embodiment, the condensation prevention system includes a timer. The timer is activated when the air temperature within the enclosure reaches the target temperature. If the enclosure is not opened in a selected period of time, the system resets and causes the temperature within the enclosure to return to the normal operating temperature.

An embodiment of the condensation prevention system utilizing one or more aspects of the present invention is shown in FIG. 1. The system may be associated with an enclosure 10 containing equipment 20. The condensation prevention system may comprise one or more temperature sensors 30 inside the enclosure, a temperature sensor 40 and a humidity sensor 50 outside the enclosure, a control system 60 to regulate the air temperature inside the enclosure, a door open sensor 70 to detect whether an enclosure door 80 is open or closed, and a control panel 90.

Figure 2:
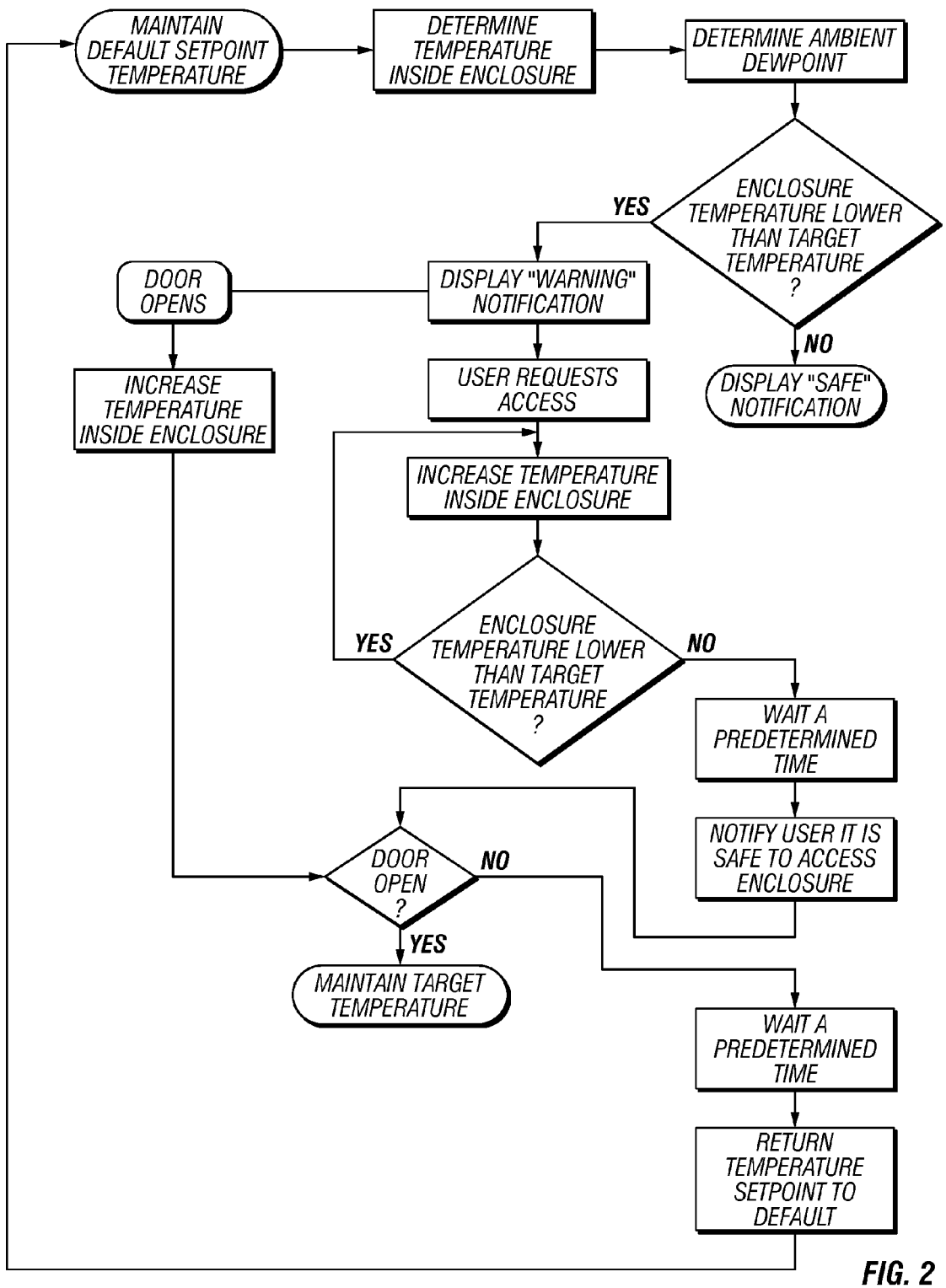
FIG. 2 is a flow chart illustrating a preferred embodiment of the invention.

FIG. 2 is a flow diagram generally illustrating a preferred method for use with embodiments of the invention. The system normally exists in a default condition. In the default condition, the operating temperature within the enclosure is maintained at a selected level appropriate for the optimal functioning of the equipment in the enclosure. While in the default condition, the system compares the air temperature inside the enclosure to the ambient dewpoint outside the enclosure. The system can be programmed to conduct this comparison at selected intervals of time, continuously, and/or at the request of a user. If the system determines that the air temperature inside the enclosure is lower than the ambient dewpoint outside the enclosure, the system causes the display to show a "condensation risk" notification alerting the user that there is a risk of condensation if the enclosure is opened.

Figure 3:
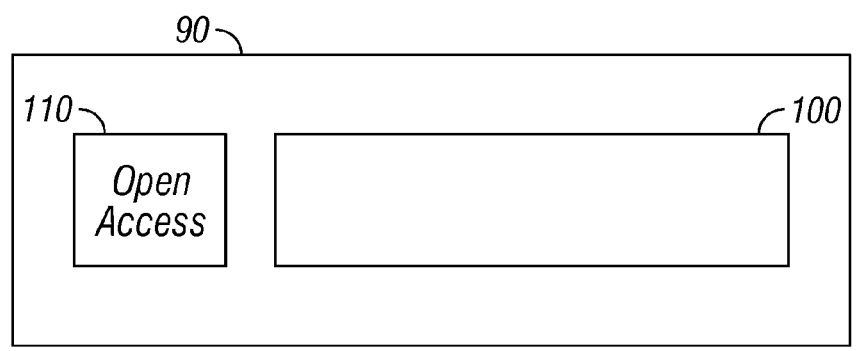
FIG. 3 illustrates the control panel of the invention.

If the user wants to open the enclosure while there is a risk of condensation, the user can request access using the control panel 90. FIG. 3 shows a control panel 90, which may comprise, for example, a display 100 and one or more user inputs 110. Once the system receives the user's request for access, the system enters an "Access Open" condition. In the "Access Open" condition, the control device changes the setpoint temperature to a target temperature that reduces or eliminates the risk of condensation. After the temperature inside the enclosure reaches the target temperature a timer is activated. Once the timer counts down, the display shows a "safe" notification advising the user that it is safe to open the enclosure. The system maintains the temperature inside the enclosure at the target temperature until one of two events takes place. If the enclosure is not opened within a selected time after the "safe" notification has been given, then the system returns to the default condition and displays the "condensation risk" notification if appropriate. If the enclosure is opened within a selected time after the "safe" notification has been given, then the system will remain in the "safe" condition until the enclosure is closed again. After the enclosure is closed, a timer counts down and the system returns to the default condition and displays the "condensation risk" notification if appropriate.

The preferred embodiment will now be described. In the default condition, a "Do Not Open: Condensation Risk" message appears in the display if the air temperature inside the enclosure is lower than the target temperature. The target temperature is the ambient dewpoint temperature of the air outside the enclosure plus a dewpoint margin. The dewpoint margin is an arbitrary, pre-selected value, in degrees Fahrenheit or Centigrade, that is added to the ambient dewpoint. The dewpoint margin provides a margin of error to compensate for any inaccuracies in the temperature measurements, and provides a safety factor to further reduce the risk of condensation forming on equipment inside the enclosure. The dewpoint margin is typically in the range of 1° to 4° Fahrenheit, which corresponds to 0.5° to 2.2° Kelvin, but may be in the range of 0° to 10° depending on the thermal mass of the enclosure and equipment. In the preferred embodiment, the dewpoint margin is 4° Fahrenheit, which corresponds to 2.2° Kelvin. Therefore, the target temperature in the preferred embodiment is equal to the ambient dewpoint plus 4° Fahrenheit.

The user requests access to the enclosure by activating an OPEN ACCESS input button 110 on control panel 90. This places the system in the "Access Open" condition. The control system then reduces cooling inside the enclosure until the air temperature inside the enclosure reaches the target temperature. When the air temperature inside the enclosure reaches the target temperature, the system activates a "Access Open Wait Timer." The "Access Open Wait Timer" is a user-selected period of time that reflects the additional time necessary for the surface temperature of the equipment to approach the target temperature. The "Access Open Wait Timer" is typically in the range of one to two minutes, but can be longer or shorter depending on the specific application. In the preferred embodiment, the "Access Open Wait Timer" is one minute. After the "Access Open Wait Timer" has finished counting down, the message "Access Open OK" appears in the display.

Once the "Access Open OK" message appears, the system will maintain the temperature inside that enclosure at the target temperature until one of two events occurs. If the system does not detect a door of the enclosure being opened within two minutes after the "Access Open OK" message appears, then the system will revert to the default condition. The setpoint temperature will be reset to the optimal temperature for the equipment in the enclosure, and normal cooling will resume. Once the air temperature inside the enclosure drops to a level below the target temperature, the "Do Not Open: Condensation Risk" message appears in the display.

If the system detects an access of the enclosure being opened within two minutes after the "Access Open OK" notification appears, then the system maintains the air temperature inside the enclosure at the target temperature until the system detects that all enclosure access points are closed. Once the enclosure is closed, the system activates a two minute "Access Reopen Timer." The "Access Reopen Timer" allows a user to briefly close the enclosure, to retrieve a necessary tool or manual for example, and regain access without having to reset the entire access opening process. If an enclosure access is opened during the two minute "Access Reopen Timer," then the timer is reset and restarted once the enclosure is closed. When the "Access Reopen Timer" expires without any access having opened, the system returns to the default condition. The setpoint temperature will be reset to the optimal temperature for the equipment in the enclosure, and normal cooling will resume. Once the air temperature inside the enclosure drops to a level below the target temperature, the "Do Not Open: Condensation Risk" message appears in the display.

In some instances, it may be necessary for a user to open the enclosure while the system is in the default condition, even though there is a risk of condensation. If the system detects an enclosure access is opened while the system is in the default condition, the system automatically switches to the "Access Open" condition. The system reduces cooling until the air temperature inside the enclosure reaches the target temperature. The system maintains the target temperature until it detects that the enclosure is once again closed. Once the enclosure is closed, the system will proceed as described above, counting down an "Access Reopen Timer" before returning to the default condition.

In another embodiment, the system further comprises a "High Cabinet Temperature" alarm. The "High Cabinet Temperature" alarm is activated if the air temperature inside the enclosure is higher than a user-selected temperature that could damage the equipment in the enclosure. When the system is in the "Access Open" condition, the "High Cabinet Temperature" alarm is disabled. Once the system returns to the default condition, the "High Cabinet Temperature" alarm is re-enabled in one of two ways, depending on the air temperature inside the enclosure.

If the air temperature inside the enclosure is below the "High Cabinet Temperature" alarm setpoint when the system returns to the default condition, then the "High Cabinet Temperature" alarm is re-enabled immediately.

If the air temperature inside the enclosure is above the "High Cabinet Temperature" alarm setpoint when the system returns to the default condition, then the control system activates the cooling system inside the enclosure for twenty seconds. After twenty seconds of cooling, the system checks to see whether the air temperature inside the enclosure is lower than it was before the twenty seconds of cooling. If the air temperature has lowered, then normal cooling continues. In this situation, the system will continue to check the air temperature inside the enclosure every twenty seconds to verify that the temperature continues to decrease until it reaches a temperature 3° Fahrenheit below the "High Cabinet Temperature" alarm setpoint. When the air temperature in the enclosure has cooled to a temperature 3° Fahrenheit below the "High Cabinet Temperature" alarm setpoint, the "High Cabinet Temperature" alarm is re-enabled. If the air temperature inside the enclosure has not lowered after the first twenty seconds of cooling, then the system will turn off the normal cooling mechanism and activate the backup ventilation for the enclosure. The system will take the same action, i.e. turn off the normal cooling mechanism and activate the backup ventilation, at any point in the cooling process if twenty seconds elapse during which the temperature does not drop.

In another embodiment, the system can lock the enclosure accesses to prevent accidental exposure of the equipment to moisture-laden outside air. This embodiment may be prohibitive in critical applications where immediate access to the equipment may be necessary. Selected users may be given special keys or magnetic cards, giving these users the ability to immediately unlock the enclosure in the event of an emergency.

Other and further embodiments utilizing one or more aspects of the inventions described above can be devised without departing from the spirit of Applicant's invention. Further, the various methods and embodiments of the condensation prevention system can be included in combination with each other to produce variations of the disclosed methods and embodiments. Discussion of singular elements can include plural elements and vice-versa.

The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to fully protect all such modifications and improvements that come within the scope or range of equivalent of the following claims.

What is claimed is:

1. A method of preventing condensation on equipment within a temperature-controlled enclosure, comprising:
   determining temperature of air in at least one location inside the enclosure;
   determining an ambient dewpoint temperature of air outside the enclosure;
   comparing the air temperature inside the enclosure to a target temperature that is equal to the ambient dewpoint temperature of air outside the enclosure; and
   increasing the air temperature inside the enclosure to the target temperature.

2. The method of claim 1, further including the step of increasing the air temperature inside the enclosure to a value equal to the ambient dewpoint temperature of air outside the enclosure plus a marginal dewpoint.

3. The method of claim 2, in which the marginal dewpoint is between 1° and 4° Fahrenheit.

4. The method of claim 1, further comprising receiving a request from a user seeking to access the enclosure.

5. The method of claim 4, further comprising notifying a user when it is safe to access the enclosure.

6. The method of claim 4, further comprising notifying a user when it is not safe to access the enclosure.

7. The method of claim 4, further comprising allowing a selected amount of time to pass before notifying the user that it is safe to access the enclosure, after the air temperature inside the enclosure reaches the target temperature.

8. The method of claim 4, further comprising returning the air temperature inside the enclosure to a default temperature after the enclosure is closed.

9. The method of claim 4, further comprising waiting a selected amount of time after the enclosure is closed before returning the air temperature inside the enclosure to the default temperature.

10. The method of claim 1, further comprising receiving a request from a user concerning to access the enclosure.

11. A method of preventing condensation on equipment within a temperature-controlled enclosure, comprising:
    detecting that an access to the enclosure is open;
    determining an ambient dewpoint temperature of air outside the enclosure;
    determining the air temperature in at least one location inside the enclosure;
    determining a safe air temperature at which condensation will not occur within the enclosure, wherein the safe air temperature is based on the ambient dewpoint temperature of air outside the enclosure;

comparing the air temperature inside the enclosure to the safe temperature; and increasing the air temperature inside the enclosure to the safe temperature.

12. The method of claim 11, in which the safe temperature has a value equal to the ambient dewpoint outside the enclosure plus a marginal dewpoint.

13. The method of claim 12, in which the marginal dewpoint is between 1° and 4° Fahrenheit.

14. The method of claim 11, further comprising returning the air temperature inside the enclosure to a default temperature after the enclosure is closed.

15. The method of claim 14, further comprising waiting a selected amount of time after the enclosure is closed before returning the temperature inside the enclosure to the default temperature.

16. A method of preventing condensation on equipment within a temperature-controlled enclosure, comprising:

determining temperature of air in at least one location inside the enclosure;

determining an ambient dewpoint temperature of air outside the enclosure;

comparing the air temperature inside the enclosure to a target temperature that is based on the ambient dewpoint temperature of air outside the enclosure; and increasing the air temperature inside the enclosure to the target temperature.

17. The method of claim 16, in which the target temperature has a value equal to the ambient dewpoint temperature of air outside the enclosure plus a marginal dewpoint.

18. The method of claim 17, in which the marginal dewpoint is between 1° and 4° Fahrenheit.

19. The method of claim 16, further comprising receiving a request from a user seeking to access the enclosure.

20. The method of claim 16, further comprising receiving a request from a user concerning access the enclosure.

* * * * *